(12) United States Patent
Park

(10) Patent No.: US 7,751,268 B2
(45) Date of Patent: Jul. 6, 2010

(54) SENSE AMPLIFIER POWER SUPPLY CIRCUIT

(75) Inventor: Sang Il Park, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 153 days.

(21) Appl. No.: 12/070,173

(22) Filed: Feb. 14, 2008

(65) Prior Publication Data

US 2009/0109777 A1   Apr. 30, 2009

(30) Foreign Application Priority Data

Oct. 31, 2007   (KR) ...................... 10-2007-0110496

(51) Int. Cl.
*G11C 7/00* (2006.01)

(52) U.S. Cl. ................... 365/205; 365/207; 365/189.07

(58) Field of Classification Search ................. 365/205, 365/207, 189.07, 189.03, 189.09, 191, 149, 365/203

See application file for complete search history.

(56) References Cited

U.S. PATENT DOCUMENTS

| 5,666,074 A | 9/1997 | Chun | |
|---|---|---|---|
| 6,028,800 A | 2/2000 | Akiba et al. | |
| 2004/0233754 A1* | 11/2004 | Kwon | 365/205 |
| 2006/0291311 A1* | 12/2006 | Won et al. | 365/206 |
| 2008/0298151 A1* | 12/2008 | Xi | 365/207 |

FOREIGN PATENT DOCUMENTS

| KR | KO-10-2003-0081979 A | 10/2003 |
|---|---|---|
| KR | 10-2005-0041623 A | 5/2005 |
| KR | KO-10-2006-0117469 A | 11/2006 |

* cited by examiner

*Primary Examiner*—Dang T Nguyen
(74) *Attorney, Agent, or Firm*—John P. White; Cooper & Dunham LLP

(57) ABSTRACT

A sense amplifier power supply circuit includes an overdriving unit configured to apply a first voltage to a sense amplifier in response to a first enable signal, a sense amplifier driving unit configured to apply a second voltage to the sense amplifier in response to a second enable signal, and a switching unit configured to selectively apply the first voltage or the second voltage to the sense amplifier in response to the first enable signal and the second enable signal.

12 Claims, 4 Drawing Sheets

SENSE AMPLIFIER POWER SUPPLY CIRCUIT

BACKGROUND

The present disclosure relates to a semiconductor memory device, and more particularly, to a sense amplifier power supply circuit.

Generally, an internal power voltage lower than an external power voltage is used in a memory storage and a bit line sense amplifier in order to reduce power consumption but improve reliability of a dynamic random access memory (DRAM). However, there is a limitation in that much time is required to sense a very small amount of electric charge flowing from a memory cell and convert the sensed electric charge into a complementary metal oxide semiconductor (CMOS) level.

In order to solve this limitation, a bit line sense amplifier overdriving method has been proposed. According to the bit line sense amplifier overdriving method, a sense amplifier operates with an external voltage in an initial operation until a voltage level reaches an internal voltage level, and then operates with an internal voltage.

In such a conventional method, the external power voltage VDD is used in the initial operation and then the internal voltage, i.e., a core voltage (VCORE) is used when a sensed data level reaches the internal voltage level (VREF).

FIG. 1 illustrates a circuit diagram of a conventional sense amplifier power supply circuit.

Referring to FIG. 1, the conventional sense amplifier power supply circuit develops a bit line of a sense amplifier through a driver that operates in response to a first enable signal SAP1 and a second enable signal SAP2.

As technology is advanced, a sub-hole area decreases. Therefore, there is a limitation in increasing a channel width of an SAP1/2 driver within a restricted area so as to improve RTO drivability.

As a result, low RTO drivability may affect a RAS to CAS delay time (tRCD), which is a speed parameter.

A core voltage noise affects peripheral circuits. As illustrated in FIG. 1, a core voltage level fluctuates after an overdriving operation is performed in response to the enable signal SAP1. The fluctuation of the core voltage level affects a delay circuit using the core voltage. Therefore, it is difficult to ensure a sufficient timing margin, deteriorating chip characteristics.

SUMMARY

Various exemplary embodiments of the present invention are described in this disclosure directed to a sense amplifier power supply circuit that can minimize a core voltage noise caused by an overdriving operation in an external voltage overdriving method so as to rapidly develop a bit line (BL) and a bit line bar (BLb).

In an aspect of this disclosure, a sense amplifier power supply circuit includes an overdriving unit configured to output a first voltage to be applied to a sense amplifier, in response to a first enable signal, a sense amplifier driving unit configured to output a second voltage to be applied to the sense amplifier, in response to a second enable signal, and a switching unit configured to selectively apply the first voltage or the second voltage to the sense amplifier in response to the first enable signal and the second enable signal.

The switching unit may apply the first voltage to the sense amplifier and interrupt supply of the second voltage, when the first enable signal is activated, and may apply the second voltage to the sense amplifier and interrupt supply of the first voltage when the second enable signal is activated.

In another aspect of this disclosure, a sense amplifier power supply circuit includes a power supply unit configured to output a first voltage and a second voltage to be applied to a sense amplifier, in response to a first enable signal and a second enable signal, respectively, and a switching unit configured to selectively apply the first voltage or the second voltage to the sense amplifier in response to the first enable signal and the second enable signal.

The switching unit may apply the first voltage to the sense amplifier and interrupt supply of the second voltage when the first enable signal is activated, and may apply the second voltage to the sense amplifier and interrupt supply of the first voltage when the second enable signal is activated.

DESCRIPTION OF EXEMPLARY EMBODIMENTS

Hereinafter, a sense amplifier power supply circuit in accordance with examples and exemplary embodiments of the present invention will be described with reference to the accompanying drawings.

Figure 1:
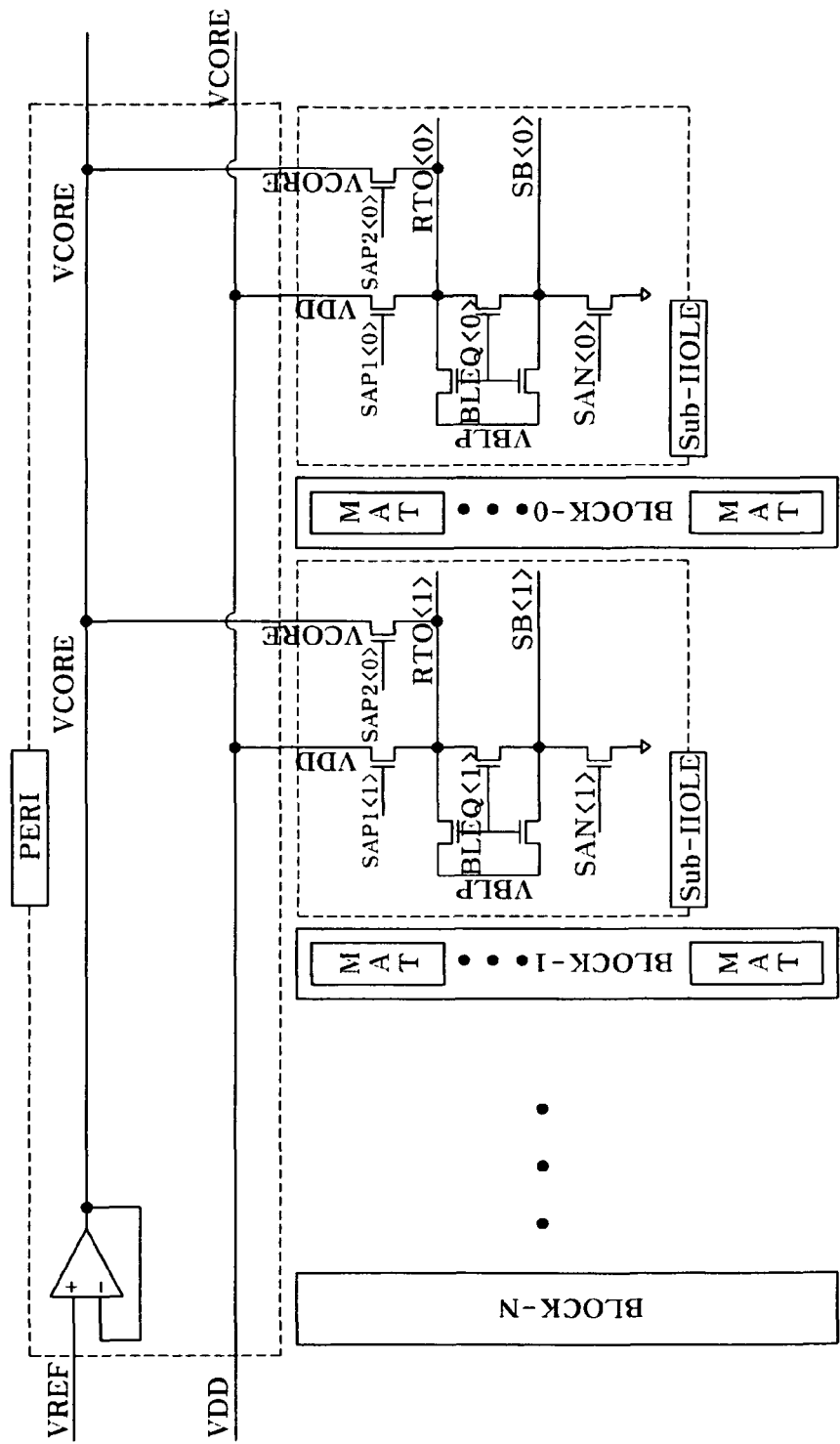
FIG. 1 illustrates a circuit diagram of a conventional sense amplifier power supply circuit.
Figure 2A:
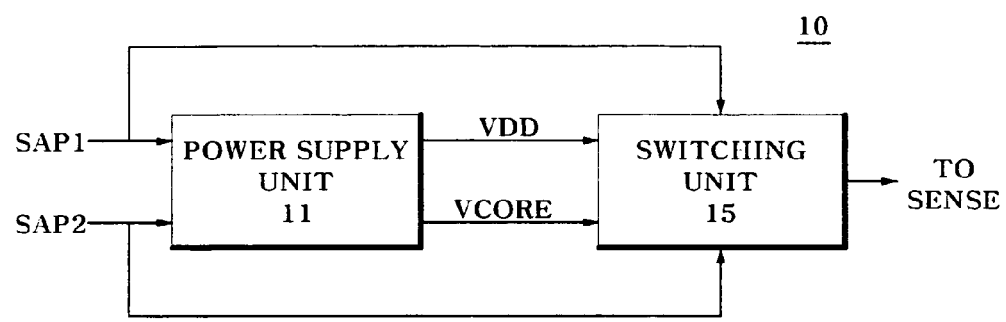
FIGS. 2A and 2B illustrate block diagrams of a sense amplifier supply circuit, in accordance with respective exemplary embodiments of the present disclosure.
Figure 2B:
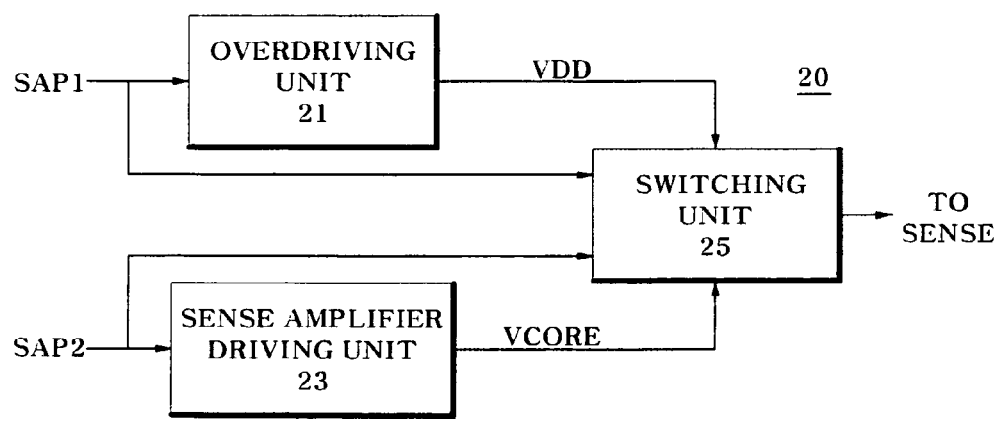

FIGS. 2A and 2B illustrate circuit diagrams of a sense amplifier power supply circuit in accordance with respective exemplary embodiments of the present disclosure.

In the exemplary embodiment of FIG. 2A, a sense amplifier power supply circuit 10 includes power supply unit 11 and switching unit 15. The power supply unit 11 outputs a voltage VDD and a voltage VCORE in response to a control signal SAP1 and a control signal SAP2. The switching unit 15 selectively applies on of the voltage VDD and the voltage VCORE to a sense amplifier in response to the signals SAP1 and SAP2.

The switching unit can apply the first voltage to the sense amplifier and interrupt a supply of the second voltage to the sense amplifier, when the first enable signal is activated, and apply the second voltage to the sense amplifier and interrupt a supply of the first voltage, when the second enable signal is activated.

The voltage VDD can be an external power voltage, and the voltage VCORE can be a core voltage. The signal SAP1 can be an external voltage overdriving enable signal, and the signal SAP2 can be a core voltage enable signal.

The power supply unit can optionally comprise an overdriving unit and a sense amplifier driving unit.

Referring to FIG. 2B, sense amplifier power supply circuit 20 includes an overdriving unit 21 which outputs external power voltage VDD (hereinafter, alternatively referred to as a first voltage) to be applied to a sense amplifier in response to a first enable signal SAP1, a sense amplifier driving unit 23 outputs a core voltage VCORE (hereinafter, alternatively referred to as a second voltage) to be applied to the sense amplifier in response to a second enable signal SAP2, and a switching unit 25 selectively applying the first voltage VDD or the second voltage VCORE to the sense amplifier in response to the first and second enable signals SAP1 and SAP2.

Figure 2C:
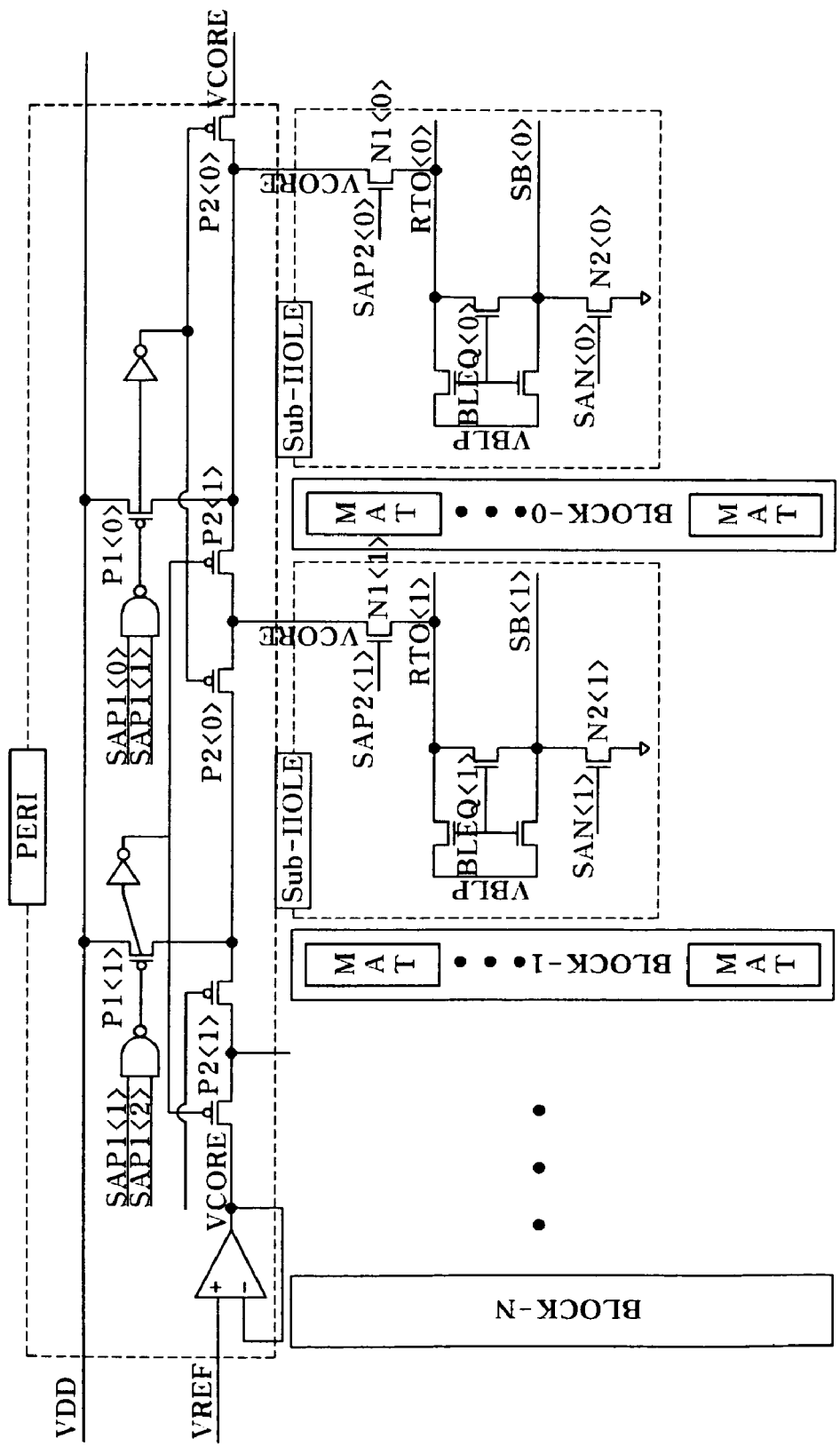
FIG. 2C illustrates a circuit diagram of a sense amplifier supply circuit in accordance with another exemplary embodiment of the present disclosure.

As shown in the circuit diagram of FIG. 2C corresponding to an example of the sense amplifier power supply circuit of FIG. 2B, the overdriving unit can include a first driver P1 applying the first voltage VDD to a high-level driving voltage line RTO of the sense amplifier in response to the first enable signal SAP1. The sense amplifier driving unit includes a second driver N1 applying the second voltage VCORE to the line RTO of the sense amplifier in response to the second enable signal SAP2. In addition, a third driver N2 is provided to apply a ground voltage VSS to a low-level driving voltage line SB of the sense amplifier in response to a third enable signal SAN.

The switching unit includes a fourth driver P2 that applies the first voltage VDD to the line RTO of the sense amplifier and interrupts supply of the second voltage VCORE to the line RTO when the first enable signal SAP1 is activated, and applies the second voltage VCORE to the sense amplifier and interrupts supply of the first voltage VDD to the line RTO when the second enable signal SAP2 is activated.

The first driver P1 and the fourth driver P2 are disposed in a peripheral circuit region (PERI), and the second driver N1 and the third driver N2 are disposed in a sub-hole region (Sub-Hole).

The first enable signal SAP1 is an external voltage overdriving enable signal, the second enable signal SAP2 is a core voltage driving enable signal, and the third enable signal SAN is a ground voltage driving enable signal. Signals SAP1, SAP2, SAN and BLEQ are similar to those in conventional sense amplifier power supply circuits.

Figure 3:
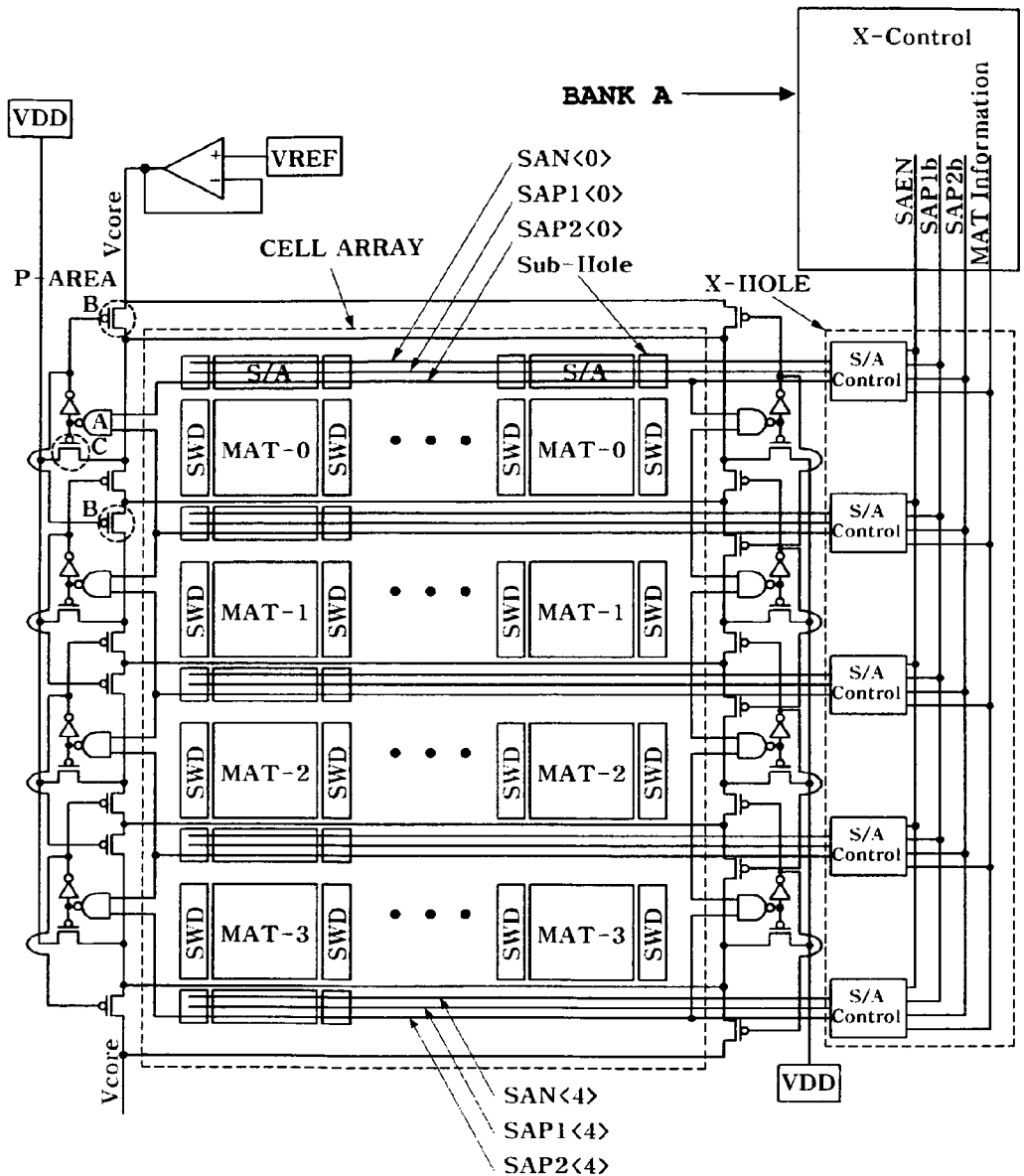
FIG. 3 illustrates a circuit diagram of a sense amplifier supply circuit in accordance with another exemplary embodiment of the present disclosure.

In the exemplary embodiment illustrated in FIG. 3, in which a cell array (CELL ARRAY) includes a plurality of blocks (Block-0, Block-1, Block-2, Block-3 corresponding to MAT-0, MAT-1, MAT-2, MAT-3), as an example, an X-control block receives a bank active signal BANK-A and outputs control signals SAEN, SAP1b, SAP2b and a MAT information signal to S/A control units for the DRAM operation. The S/A Control units for the respective blocks, in an X-hole region (X-HOLE), generate signals SAN, SAP1 and SAP2 using the signals SAEN, SAP1b, SAP2b, and the MAT information signal.

Voltage levels of bit lines BL and BLb of the sense amplifier are developed for detecting cell data information of a MAT-0 cell block. Signals RTO and SB are used for developing the voltage levels of the bit lines BL and BLb.

The sense amplifier power supply circuit illustrated in FIG. 3 employs an overdriving scheme in which the external voltage VDD having a power supply capability higher than that of the core voltage VCORE is used to drive the signal line RTO so as to rapidly develop the voltages of the bit lines BL and BLb.

The external voltage overdriver P1 is disposed outside the cell-array region (CELL ARRAY), and the switching driver P2 is configured to separate the core voltage in each block so as to minimize noise of the core voltage. The external voltage overdriver P1 and the switching driver P2 determine whether to operate the external voltage overdriver and whether to interrupt the core voltage in response to an enable signal generated based on a block information signal.

For example, when a word line of a block BLOCK-0, corresponding to MAT-0 in FIG. 3, is selected, the enable signals SAP1<0> and SAP1<1> change from a low level to a high level and thus a NAND gate A outputs a low level signal. Therefore, a transistor C overdriving the power voltage VDD is turned-on, and the transistors B and B' receive a high level signal at respective gates thereof, so that the core voltage VCORE is interrupted.

As described above, the noise generated during an external voltage overdriving operation does not affect peripheral circuits because core voltage lines are cut off during the external voltage overdriving operation. Consequently, the sense amplifier can stably develop the bit line and bit line bar by stably overdriving the external voltage.

While the present invention has been described with respect to examples and exemplary embodiments, it will be apparent to those skilled in the art that various changes and modifications may be made without departing from the spirit and scope of the disclosure and the following claims. For example, elements and/or features of different examples and exemplary embodiments, may be combined with each other and/or substituted for each other within the scope of this disclosure and appended claims.

The present disclosure claims priority to Korean patent application number 10-2007-0110496, filed on Oct. 31, 2007, the entire contents of which are incorporated herein by reference.

What is claimed is:

1. A sense amplifier power supply circuit, comprising:
   an overdriving unit configured to output a first voltage to be applied, in response to a first enable signal;
   a sense amplifier driving unit configured to output a second voltage to be applied to the sense amplifier, in response to a second enable signal; and
   a switching unit configured to selectively apply one of the first voltage and the second voltage to the sense amplifier in response to the first enable signal and the second enable signal.

2. The sense amplifier power supply circuit of claim 1, wherein the switching unit applies the first voltage to the sense amplifier and interrupts a supply of the second voltage to the sense amplifier, when the first enable signal is activated, and applies the second voltage to the sense amplifier and interrupts a supply of the first voltage to the sense amplifier, when the second enable signal is activated.

3. The sense amplifier power supply circuit of claim 1, wherein the overdriving unit and the switching unit are disposed in a peripheral circuit region, and the sense amplifier driving unit is disposed in a sub-hole region.

4. The sense amplifier power supply circuit of claim 1, wherein the first voltage is an external power voltage, and the second voltage is a core voltage.

5. The sense amplifier power supply circuit of claim 1, wherein the first enable signal is an external voltage overdriving enable signal, and the second enable signal is a core voltage enable signal.

6. A sense amplifier power supply circuit, comprising:
   a first switch configured to be turned on in response to a control signal enabled during an overdriving section, and supply a first voltage to a first node;
   a second switch configured to be turned on in response to the control signal, and supply a voltage of the first node to a second node;
   a third switch configured to be turned off in response to the control signal, and interrupt a supply of a second voltage to the second node
   a driving unit configured to supply a voltage of the second node to a sense amplifier in response to an enable signal.

7. The sense amplifier power supply circuit of claim 6, wherein the first voltage is an external power voltage, and the second voltage is a core voltage.

8. The sense amplifier power supply circuit of claim 6, wherein the control signal is an external voltage overdriving enable signal, and the enable signal is a core voltage enable signal.

9. The sense amplifier power supply circuit of claim 6, wherein the first, second and third switch are disposed in a peripheral circuit region, and the driving unit is disposed in a sub-hole region.

10. A sense amplifier power supply circuit comprising:
   a power supply unit configured to output a first voltage and a second voltage be applied to a sense amplifier in response to a first enable signal and a second enable signal, respectively; and
   a switching unit configured to selectively apply one of the first voltage and the second voltage to the sense amplifier in response to the first enable signal and the second enable signal,
   wherein the power supply unit comprises:
   an overdriving unit configured to output the first voltage to be applied to the sense amplifier, in response to the first enable signal; and
   a sense amplifier driving unit configured to output the second voltage to be applied to the sense amplifier, in response to the second enable signal.

11. The sense amplifier power supply circuit of claim 10, wherein the switching unit applies the first voltage to the sense amplifier and interrupts a supply of the second voltage to the sense amplifier, when the first enable signal is activated, and applies the second voltage to the sense amplifier and interrupts a supply of the first voltage, when the second enable signal is activated.

12. The sense amplifier power supply circuit of claim 10, wherein the overdriving unit and the switching unit are disposed in a peripheral circuit region, and the sense amplifier driving unit is disposed in a sub-hole region.

* * * * *